United States Patent
Wang et al.

(10) Patent No.: US 10,854,686 B2
(45) Date of Patent: Dec. 1, 2020

(54) PACKAGE STRUCTURE CONSISTING OF QUANTUM DOT MATERIAL AND PACKAGING METHOD FOR ORGANIC ELECTROLUMINESCENCE ELEMENT AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Kai Wang, Beijing (CN); Yongliang Zhao, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/747,625

(22) PCT Filed: Jun. 22, 2017

(86) PCT No.: PCT/CN2017/089490
§ 371 (c)(1),
(2) Date: Jan. 25, 2018

(87) PCT Pub. No.: WO2018/095027
PCT Pub. Date: May 31, 2018

(65) Prior Publication Data
US 2019/0035855 A1 Jan. 31, 2019

(30) Foreign Application Priority Data
Nov. 28, 2016 (CN) .......................... 2016 1 1062387

(51) Int. Cl.
*H01L 33/44* (2010.01)
*H01L 27/32* (2006.01)
(Continued)

(52) U.S. Cl.
CPC ............ *H01L 27/322* (2013.01); *C09K 11/06* (2013.01); *C09K 11/08* (2013.01); *G03F 7/0002* (2013.01);
(Continued)

(58) Field of Classification Search
CPC ............................. H01L 51/524; H01L 51/502
See application file for complete search history.

(56) References Cited

U.S. PATENT DOCUMENTS

2006/0197437 A1   9/2006  Krummacher et al.
2014/0147577 A1*  5/2014  Lee .......................... H01L 51/56
                                                                          427/8
(Continued)

FOREIGN PATENT DOCUMENTS

CN    103545404 A    1/2014
CN    104576961 A    4/2015
(Continued)

OTHER PUBLICATIONS

B. Xie et al., "Quantum Dots-Converted Light-Emitting Diodes Packaging for Lighting and Display: Status and Perspectives", Apr. 19, 2016, J. of Electronic Packaging, vol. 138, pp. 020803-1-020803-13 (Year: 2016).*
(Continued)

*Primary Examiner* — Suberr L Chi

(57) ABSTRACT

A package structure and packing method for an organic electroluminescence element and an organic electroluminescence device are provided. The package structure for the organic electroluminescence element includes: a substrate, an organic electroluminescence element, and a quantum dot
(Continued)

packaging layer. The organic electroluminescence element is disposed on the substrate, the quantum dot packaging layer is disposed on the substrate and the organic electroluminescence element, and consists of a quantum dot material.

14 Claims, 5 Drawing Sheets

(51) Int. Cl.
| | |
|---|---|
| H01L 51/52 | (2006.01) |
| H01L 51/56 | (2006.01) |
| C09K 11/06 | (2006.01) |
| G03F 7/00 | (2006.01) |
| C09K 11/08 | (2006.01) |
| B82Y 20/00 | (2011.01) |
| B82Y 40/00 | (2011.01) |

(52) U.S. Cl.
CPC ............ *H01L 51/524* (2013.01); *H01L 51/56* (2013.01); *B82Y 20/00* (2013.01); *B82Y 40/00* (2013.01); *H01L 2251/5315* (2013.01); *H01L 2251/5369* (2013.01)

(56) References Cited

U.S. PATENT DOCUMENTS

| | | | | |
|---|---|---|---|---|
| 2014/0291658 | A1* | 10/2014 | Muller | ................ H01L 51/5253 |
| | | | | 257/40 |
| 2015/0021549 | A1* | 1/2015 | Zhang | .................... H01L 33/06 |
| | | | | 257/13 |
| 2015/0280091 | A1* | 10/2015 | Huang | .................... H01L 33/02 |
| | | | | 438/27 |
| 2016/0079316 | A1* | 3/2016 | Zhou | .................... H01L 51/5278 |
| | | | | 257/13 |
| 2016/0104827 | A1* | 4/2016 | Hong | ..................... H01L 33/56 |
| | | | | 349/71 |
| 2017/0271563 | A1* | 9/2017 | Durgan | ................ C09K 11/025 |
| 2018/0019371 | A1* | 1/2018 | Steckel | .................. C09K 11/75 |
| 2018/0240944 | A1* | 8/2018 | Yoshimura | ............ H01L 33/502 |

FOREIGN PATENT DOCUMENTS

| | | |
|---|---|---|
| CN | 105304684 A | 2/2016 |
| CN | 105609656 A | 5/2016 |
| CN | 105754603 A | 7/2016 |
| CN | 105932039 A | 9/2016 |
| CN | 106129229 A | 11/2016 |
| CN | 106505157 A | 3/2017 |

OTHER PUBLICATIONS

Choi et al., EP 1798783 A1, Jun. 20, 2007.*
The First Chinese Office Action dated Sep. 5, 2017; Appln. No. 201611062387.9.
International Search Report and Written Opinion dated Sep. 26, 2017; PCT/CN2017/089490.

* cited by examiner

PACKAGE STRUCTURE CONSISTING OF QUANTUM DOT MATERIAL AND PACKAGING METHOD FOR ORGANIC ELECTROLUMINESCENCE ELEMENT AND DISPLAY DEVICE

TECHNICAL FIELD

Embodiments of the present disclosure relate to a package structure and packaging method for an organic electroluminescence element, and an organic electroluminescence display device.

BACKGROUND

An organic electroluminescence element (for example, an organic light emitting diode, OLED) generally includes a substrate, an anode, a hole injection layer (HIL), a hole transport layer (HTL), an organic light emitting layer (EML), an electron transport layer (ETL), an electron injection layer (EIL), a cathode, a packaging layer and a packaging cover plate. Compared with a LCD display device, an OLED display device has the advantages such as thin thickness, light weight, wide viewing angle, active luminescence, low costs, fast responding speed, low power consumption, low driving voltage, simple processes, and flexible display. OLED has drawn considerable attention from the industry and science due to its incomparable advantages over other displays.

SUMMARY

At least one embodiment of the present disclosure provides a package structure and packaging method for an organic electroluminescence element and an organic electroluminescence device, so as to solve the problem of the packaging sealing performance of a package structure for an organic electroluminescence element.

At least one embodiment of the present disclosure provides a package structure for an organic electroluminescence element, comprising: a substrate; an organic electroluminescence element, disposed on the substrate; and a quantum dot packaging layer, disposed on the substrate and the organic electroluminescence element, and consisting of a quantum dot material.

For example, in the package structure for the organic electroluminescence element provided by at least one embodiment of the present disclosure, quantum dots in the quantum dot packaging layer are closely arranged to form a compact layer.

For example, in the package structure for the organic electroluminescence element provided by at least one embodiment of the present disclosure, the quantum dot packaging layer completely covers a side surface and an upper surface of the organic electroluminescence element.

For example, in the package structure for the organic electroluminescence element provided by at least one embodiment of the present disclosure, the quantum dot material comprises a core-shell quantum dot material, and the core-shell quantum dot material comprises at least two layers of core-shell layer structures.

For example, in the package structure for the organic electroluminescence element provided by at least one embodiment of the present disclosure, the at least two layers of core-shell layer structures have different materials.

For example, in the package structure for the organic electroluminescence element provided by at least one embodiment of the present disclosure, the core-shell quantum dot material includes a core material and a shell material, the shell material is a water-oxygen erosion resistant material, and the core material is a light-transmitting luminescent material.

For example, in the package structure for the organic electroluminescence element provided by at least one embodiment of the present disclosure, the organic electroluminescence element comprises at least one selected from the group consisting of a red organic electroluminescence element, a green organic electroluminescence element, a blue organic electroluminescence element and a white organic electroluminescence element.

For example, in the package structure for the organic electroluminescence element provided by at least one embodiment of the present disclosure, the quantum dot material comprises at least one selected from the group consisting of zinc oxide, graphene, CdSe, CdS, CdTe, ZnSe, ZnTe and ZnS.

For example, in the package structure for the organic electroluminescence element provided by at least one embodiment of the present disclosure, the quantum dot material comprises quantum dot materials of different luminescent wavelengths.

For example, in the package structure for the organic electroluminescence element provided by at least one embodiment of the present disclosure, the quantum dot packaging layer is formed through an imprint method.

For example, in the package structure for the organic electroluminescence element provided by at least one embodiment of the present disclosure, the organic electroluminescence element is a top emitting type organic electroluminescence element.

At least one embodiment of the present disclosure provides an organic electroluminescence device, comprising a package structure for an organic electroluminescence element, wherein a plurality of organic electroluminescence elements are disposed on the substrate in an array.

At least one embodiment of the present disclosure provides a packaging method for an organic electroluminescence element, comprising: providing a substrate; forming an organic electroluminescence element on the substrate; and forming a quantum dot packaging layer on the substrate and the organic electroluminescence element, the quantum dot packaging layer consisting of a quantum dot material.

For example, in the packaging method for the organic electroluminescence element provided by at least one embodiment of the present disclosure, forming the quantum dot packaging layer comprises: forming a compact quantum dot packaging layer in which quantum dots are closely arranged.

For example, in the packaging method for the organic electroluminescence element provided by at least one embodiment of the present disclosure, using an imprint method to form the quantum dot packaging layer.

For example, in the packaging method for the organic electroluminescence element provided by at least one embodiment of the present disclosure, the using the imprint method to form the quantum dot packaging layer comprises: applying the quantum dot material on an imprint substrate; using a silicon wafer having a pattern to select the quantum dot material and imprinting the quantum dot material on a base; and transferring the quantum dot material imprinted on the base to the substrate and the organic electroluminescence element.

For example, in the packaging method for the organic electroluminescence element provided by at least one embodiment of the present disclosure, transferring the quantum dot material imprinted on the base to the substrate and the organic electroluminescence element comprises: covering the substrate and the organic electroluminescence element with the quantum dot material imprinted on the base to completely cover a side surface and an upper surface of the organic electroluminescence element.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

Figure 1:
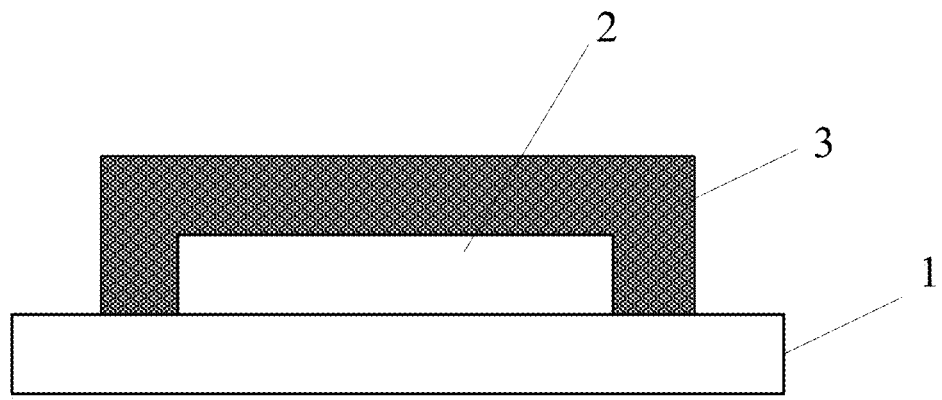
FIG. 1 is a structural schematic diagram of a package structure for an organic electroluminescence element provided by at least one embodiment of the present disclosure.

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used herein have the same meanings as commonly understood by one of ordinary skill in the art to which the present disclosure belongs. The terms "first", "second", etc., which are used in the description and the claims of the present disclosure, are not intended to indicate any sequence, amount or importance, but distinguish various components. The terms "comprises", "comprising", etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Researches show that: components such as moisture and oxygen in the air has a great effect on the lifetime of an organic electroluminescence element (for example, an OLED), and the reason can be considered from the following aspects: an OLED element will inject electrons from a cathode upon working, which requires that the lower the work function of the cathode, the better; however, metals such as aluminum, magnesium and calcium for forming the cathode are generally active, and are easy to react with the permeated moisture. In addition, the moisture will also produce chemical reaction with the hole transport layer and the electron transport layer (ETL), and these reactions will result invalidation of the element. Thus, the lifetime of an OLED can be greatly prolonged by performing effective package to an OLED to isolate the function layers in the device from the components such as moisture and oxygen in the air.

Traditional packaging method using a rigid material such as glass and metal as a cover plate and using epoxy resin to bond cannot satisfy the packaging requirement of a flexible OLED; a metal cover plate is easy to contact the electrodes of the device and result short circuit, epoxy resin is easy to fail due to light, the drying agent will absorb the light emitted from the element, and the volume and weight of the element after packaging are relatively large. And the high temperature produced by a glass sintering packaging method is a fatal damage to the element. Besides, because of the effect of the factors such as the material of OLED element, the luminous color gamut of the element is not very ideal, the preparations of blue light and red light elements are not very ideal, upon using a traditional method to realize full-color display of a top-emitting organic electroluminescence element, the package of the element will relate to the alignment with a color filter film, which results a damage to the electrodes caused by the friction upon the alignment.

At least one embodiment of the present disclosure provides a package structure of an organic electroluminescence element. FIG. 1 is a structural schematic diagram of a package structure for an organic electroluminescence element provided by at least one embodiment of the present disclosure. As illustrated by FIG. 1, the package structure for an organic electroluminescence element provided by the present embodiment can include a substrate 1, an organic electroluminescence element 2 and a quantum dot packaging layer 3. In the present embodiment, the organic electroluminescence element 2 is disposed on the substrate 1, for example, a flexible substrate, the quantum dot packaging layer 3 is disposed on the substrate 1 and the organic electroluminescence element 2 to cover the organic electroluminescence element 2 and the substrate 1, and the quantum dot packaging layer 3 consists of a quantum dot material. Because quantum dot material is an inorganic material, which has a better water-oxygen erosion resistant ability than an organic semiconductor, thus, the quantum dot packaging layer can avoid the erosion of water and oxygen to the organic electroluminescence element.

The package structure for an organic electroluminescence element provided by the present embodiment includes a substrate, an organic electroluminescence element, and a quantum dot packaging layer, the organic electroluminescence element is disposed on the substrate, the quantum dot packaging layer is disposed on the substrate and the organic electroluminescence element, and the quantum dot packaging layer consists of a quantum dot material, so as to significantly improve the sealing performance of an organic electroluminescence element, avoid the erosion of water and oxygen, and effectively prolong the serve life of the device.

Hereinafter, some embodiments are described in the following.

First Embodiment

Figure 2:
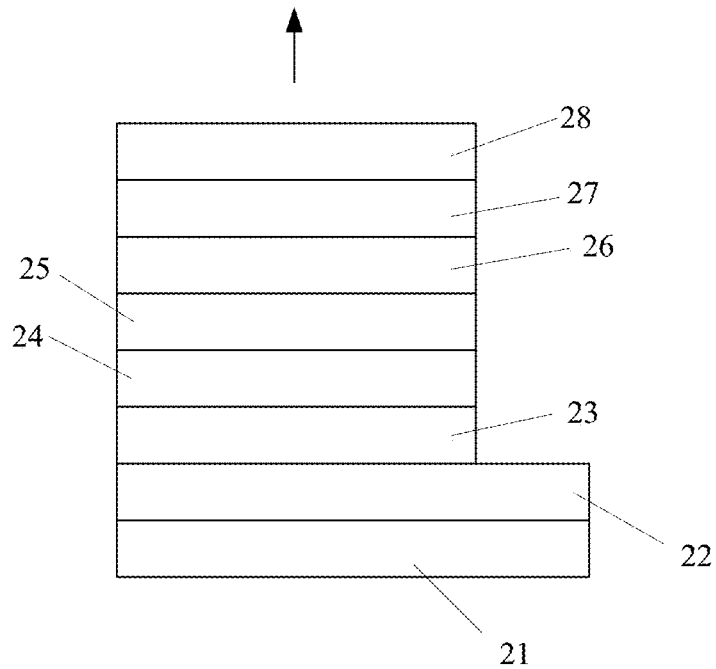
FIG. 2 is a positive structural schematic diagram of an OLED element of a package structure for an organic electroluminescence element provided by at least one embodiment of the present disclosure.

The present embodiment provides a package structure for an organic electroluminescence element. FIG. 2 is a structural schematic diagram of an electroluminescence element in a package structure for an organic electroluminescence element provided by at least one embodiment of the present disclosure. As illustrated by FIG. 2, the organic electroluminescence element provided by the present embodiment can be a top emitting type organic electroluminescence element, taking a positive top emitting type organic electroluminescence element as an example, the positive top emitting OLED element can include a substrate 21, an anode 22, a hole injection layer 23, a hole transport layer 24, an organic light emitting layer 25, an electron transport layer 26, an electron injection layer 27 and a cathode 28. For example, the reflective light is emitted from a side of the cathode in a direction away from the substrate. The quantum dot packaging layer covers on the cathode, and the reflective light is emitted after passing through the quantum dot packaging layer.

For example, the substrate 21 in the present embodiment is a flexible substrate or a rigid substrate, and the substrate 21 can be a glass substrate, a silicon wafer, a metal substrate or a plastic substrate.

For example, as illustrated by FIG. 1, quantum dots in the quantum dot packaging layer 3 are closely arranged to form a compact layer, the compact layer can effectively prevent the permeation of moisture and erosion of oxygen. For example, in the quantum dot packaging layer 3, the quantum dots are closely arranged to form a compact layer, without other bonding structures, and no solvent is needed in the process of forming the packaging layer. That is to say, in some example, the quantum dot packaging layer merely includes quantum dots which are closely arranged.

In at least one embodiment of the present disclosure, the quantum dot packaging layer 3 completely covers the side surface and the upper surface of the organic electroluminescence element 2 (as illustrated by FIG. 1), and the quantum dot packaging layer 3 is tightly connected with the substrate 1, so as to provide a good hermetical space for the inside organic electroluminescence element 2, and effectively prolong the serve life of an organic electroluminescence element.

For example, the quantum dot packaging layer 3 is formed through an imprint method, and is covered on the organic electroluminescence element 2 and the substrate 1 through a transferring method. The density and the consistency of the quantum dots of the quantum dot packaging layer 3 formed through the abovementioned method is higher, which is favorable to produce a brighter image with higher energy efficiency.

For example, the quantum dot packaging layer 3 is mostly formed of a quasi-zero dimensional material consisting of elements from II-VI family and III-V family, and the sizes of its three dimensions are all within the 1-10 nm. These quantum dot materials can be at least one selected from the group consisting of zinc oxide (ZnO), grapheme, cadmium selenide (CdSe), cadmium sulfide (CdS), cadmium telluride (CdTe), zinc selenide (ZnSe), zinc telluride (ZnTe) and zinc sulfide (CdS).

For example, the quantum dot material includes quantum dot materials of different luminescent wavelengths. Quantum dots have different optical performance from a block material, the quantum dot material is a direct band gap semiconductor, whose fluorescent wavelength covers a relatively wide range from an ultraviolet wavelength to an infrared wavelength, and thereby having a wide application prospect in the technical field of solid luminescence. Besides, compared with a block material, these quantum dots have higher fluorescent efficiency due to a quantum confinement effect; compared with a traditional light emitting material, the quantum dot material has a better palette feature, i.e., the fluorescent color of the same kind of quantum dot material can be changed to emit a light with narrower wave band and saturated color only by changing the size of the quantum dots, so as to effectively improve the color gamut of OLED element.

For example, the organic electroluminescence element includes at least one selected from the group consisting of a red OLED (R), a green OLED (G), a blue OLED (B), and a white OLED. The material of the light emitting layer of the organic electroluminescence element can be a molecular material or a polymer material, wherein the molecule can form a film through a vacuum evaporation method, the evaporation machine is under an air pressure with a vacuum degree lower than $1 \times 10^{-5}$ Pa; the polymer material can form a film through a spin coating method; the anode material generally is ITO (Indium Tin Oxide) or Ag, and the cathode material generally is Ag or Al.

Upon the light emitted from the organic electroluminescence element, such as red light emitted from a red OLED, passing through the quantum dot packaging layer 3, a light with more saturated color and wider color gamut can be obtained through the fluorescent effect and the palette feature of the quantum dot packaging layer 3.

Figure 3:
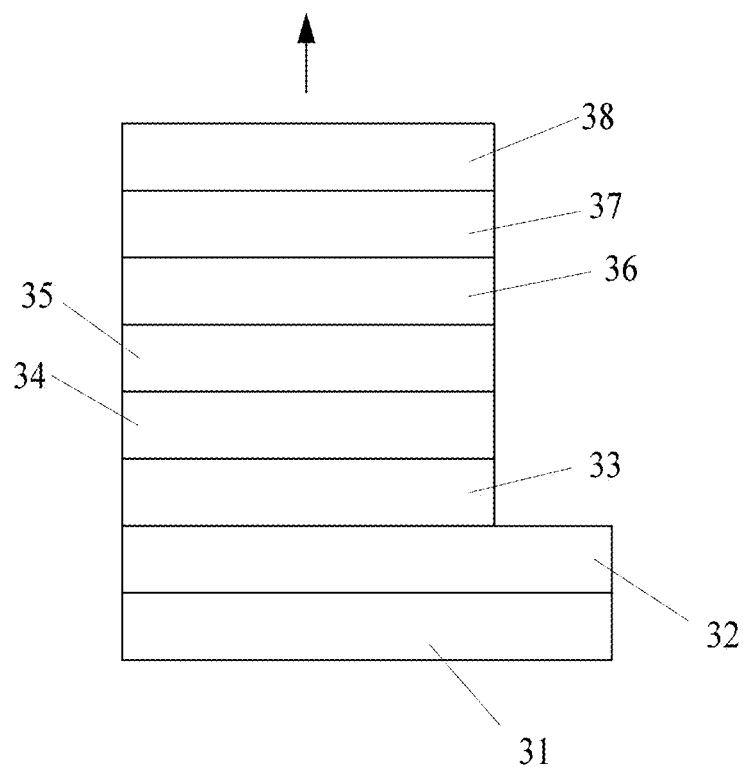
FIG. 3 is an inverted structural schematic diagram of an OLED element of a package structure for an organic electroluminescence element provided by at least one embodiment of the present disclosure.

In the other embodiments of the present disclosure, the organic electroluminescence element can be an inverted organic electroluminescence element. For example, FIG. 3 is a structural schematic diagram of an OLED element of a package structure for an organic electroluminescence element provided by at least one embodiment of the present disclosure, and inverted organic electroluminescence element can include a substrate 31, a cathode 32, a electron injection layer 33, an electron transport layer 34, an organic light emitting layer 35, a hole transport layer 36, a hole injection layer 37 and an anode 38. For example, reflective light is emitted from a side of the anode in a direction away from the substrate. The package structure for an organic electroluminescence element of the inverted organic electroluminescence element has similar structure and realization principle as the positive organic electroluminescence element, and the repeated portions are omitted herein.

Second Embodiment

At least one embodiment of the present disclosure provides a package structure for an organic electroluminescence element. On the basis of the package structure for an organic electroluminescence element provided by the abovementioned first embodiment, the quantum dot material of the present embodiment can include a core-shell quantum dot material, and the core-shell quantum dot material comprises at least two layers of core-shell layer structures sequentially formed from a core to a shell.

For example, the materials of the at least two layers of core-shell layer structures are different. The materials of the at least two layers of core-shell layer structures can be at least two selected from the group consisting of zinc oxide (ZnO), grapheme, cadmium selenide (CdSe), cadmium sulfide (CdS), cadmium telluride (CdTe), zinc selenide (ZnSe), zinc telluride (ZnTe) and zinc sulfide (CdS).

For example, a shape of the core-shell quantum material can be a sphere. In the other embodiments of the present disclosure, the shape of the core-shell quantum material can be a tube or other suitable shape, which is not described in detail herein.

Figure 4:
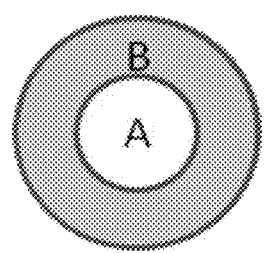
FIG. 4 is a structural schematic diagram of a core-shell quantum dot provided by at least one embodiment of the present disclosure.
Figure 5:
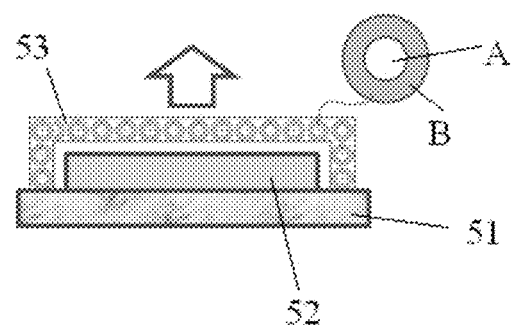
FIG. 5 is a structural schematic diagram of a package structure for an organic electroluminescence element having a core-shell quantum dot provided by at least one embodiment of the present disclosure.

For example, FIG. 4 is a structural schematic diagram of a core-shell quantum dot provided by at least one embodiment of the present disclosure. FIG. 5 is a structural schematic diagram of a package structure for an organic electroluminescence element having a core-shell quantum dot provided by at least one embodiment of the present disclosure. As illustrated by FIG. 5, the light emitted from the organic electroluminescence element passes through the compact layer formed by the core-shell quantum dot material. In the present embodiment, the at least two layers of core-shell layer structures of the core-shell quantum dot consists of a core layer (A illustrated in FIG. 4 and FIG. 5) and a shell layer (B illustrated in FIG. 4 and FIG. 5), wherein the core layer is completely encapsulated by the shell layer. The core-shell quantum dot material includes a core material of the core layer A and a shell material of the shell layer B, the shell material is a material with relatively good water-oxygen erosion resistant performance, and the core material is a material with relatively good light-transmitting luminescent performance. Besides, in the present embodiment, the core-shell quantum dot has a sphere shape.

The core-shell quantum dot material in the present embodiment has a better water-oxygen erosion resistant performance over an ordinary quantum dot material. And, compared with an ordinary quantum dot material, the core-shell quantum dot material in the present embodiment has a better fluorescent characteristic and a better palette feature.

Third Embodiment

Figure 6:
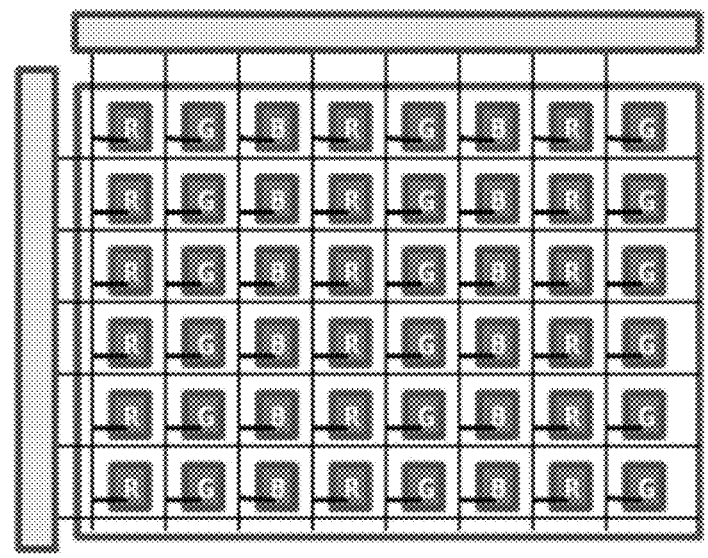
FIG. 6 is a structural schematic diagram of a packaging display device of an organic electroluminescence element provided by at least one embodiment of the present disclosure.

At least one embodiment of the present disclosure provides an organic electroluminescence device. FIG. 6 is a structural schematic diagram of an organic electroluminescence device provided by at least one embodiment of the present disclosure. As illustrated by FIG. 6, the organic electroluminescence device includes a plurality of red pixel columns, a plurality of green pixel columns, and a plurality of blue pixel columns which are sequentially and repeatedly arranged at intervals, so as to make the display device emit red light, green light, and blue light corresponding to the red pixel columns, green pixel columns, and blue pixel columns. For example, light emitted from the organic electroluminescence element is incident to the quantum dot packaging layer and excites the quantum dots in the quantum dot packaging layer to emit light with the corresponding color. These OLEDs of the pixel columns with different colors are caused by a quantum dot band with a certain color formed by imprinting the quantum dot material with the same color in a column upon the quantum dot being transferred, i.e., is formed by the quantum dot packaging layer including the red quantum dot band, the green quantum dot band and the blue quantum dot band. Besides, OLEDs of the pixel columns with different colors are respectively connected with a gate line and a data line, and are divided into a plurality of pixel regions by the gate line and the data line.

Although FIG. 6 illustrates a package structure for an organic electroluminescence element in which the same column only includes the same color as an example, the embodiments of the present disclosure are not limited thereto. For example, the package structure of organic electroluminescence elements with different colors can adopt any other suitable arrangement to be applied to a color display.

In the practical application, the display apparatus having the organic electroluminescence display device can be a cellphone, a television, a computer, an instrument board and so on. The organic electroluminescence display device can include the package structure for an organic electroluminescence element.

The package structure for an organic electroluminescence element included by the organic electroluminescence display device provided by the present embodiment can be the package structure for the organic electroluminescence element according to the abovementioned embodiments, and the specific structure is similar, the realization principle is the same, and the repeated portions are omitted herein.

Fourth Embodiment

Figure 7:
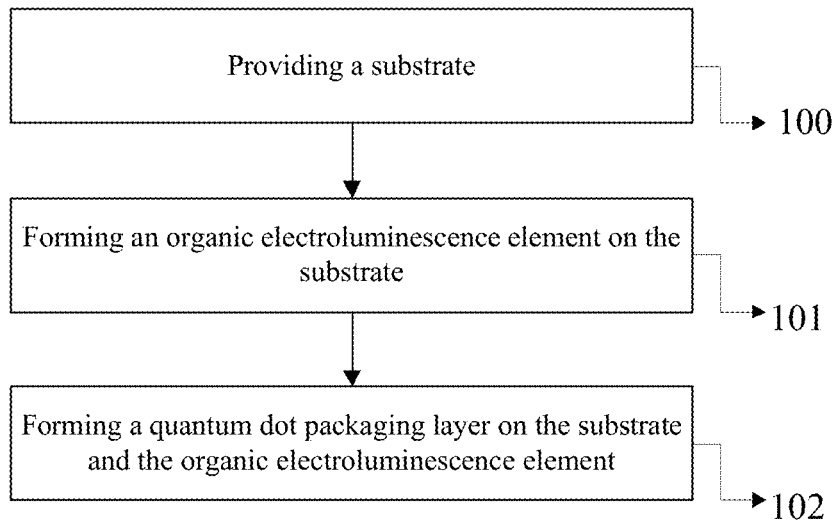
FIG. 7 is a flow diagram of a packaging method for an organic electroluminescence element provided by at least one embodiment of the present disclosure.

At least one embodiment of the present disclosure provides a packaging method for an organic electroluminescence element. FIG. 7 is a flow schematic diagram of a packaging method for an organic electroluminescence element provided by at least one embodiment of the present disclosure. As illustrated by FIG. 7, the packaging method for an organic electroluminescence element includes the following steps:

100: Providing a substrate;

102: Forming an organic electroluminescence element on the substrate; and

103: Forming a quantum dot packaging layer on the substrate and the organic electroluminescence element.

The package structure for an organic electroluminescence element in the packaging method for an organic electroluminescence element can be the package structure for an organic electroluminescence element according to the embodiment illustrated by FIG. 1, and its specific structure, such as a substrate, an organic electroluminescence element, and a quantum dot packaging layer are similar to the substrate, the organic electroluminescence element, and the quantum dot packaging layer in the present embodiment, and the realization principles are the same, the repeated portions are omitted herein.

The packaging method for an organic electroluminescence element provided by the present embodiment includes: providing a substrate, forming an organic electroluminescence element on the substrate, and forming a quantum dot packaging layer on the substrate and the organic electroluminescence element, so as to significantly improve the sealing performance of an OLED display device, avoid the erosion of water and oxygen, and effectively prolong the serve life of the device.

At least one embodiment of the present disclosure provides a packaging method for an organic electroluminescence element, taking a positive organic electroluminescence element as an example, the packaging method for an organic electroluminescence element can specifically include the following steps.

For example, in at least one embodiment of the present embodiment, forming a quantum dot packaging layer includes forming a compact quantum dot packaging layer in which quantum dots are closely arranged.

For example, in at least one embodiment of the present disclosure, forming the organic electroluminescence element includes: sequentially forming an anode, a hole injection layer, a hole transport layer, an organic light emitting layer, an electron transport layer, an electron injection layer and a cathode.

For example, in at least one embodiment of the present disclosure, using an imprint method to form the quantum dot packaging layer. Specifically, using an imprint method to form the quantum dot packaging layer includes:

Step 1: applying a quantum dot material on an imprint substrate;

Step 2: using a silicon wafer having a pattern to select the quantum dot material and imprint the quantum dot material on a base;

Step 3: transferring the quantum dot material imprinted on the base to the substrate and the organic electroluminescence element.

For example, the silicon wafer having a pattern can be a silicon wafer having a protruded pattern, upon the silicon wafer being impressed on the imprint substrate coated with the quantum dot material; the protruded pattern can be adhered with the quantum dot material, that is, an inking operation to the silicon wafer.

Furthermore, transferring the quantum dot material imprinted on the base to the substrate and the organic electroluminescence element in step 3 can include: covering the substrate and the organic electroluminescence element with the quantum dot material imprinted on the base to completely cover the side surface and the upper surface of the organic electroluminescence element.

Figure 8:
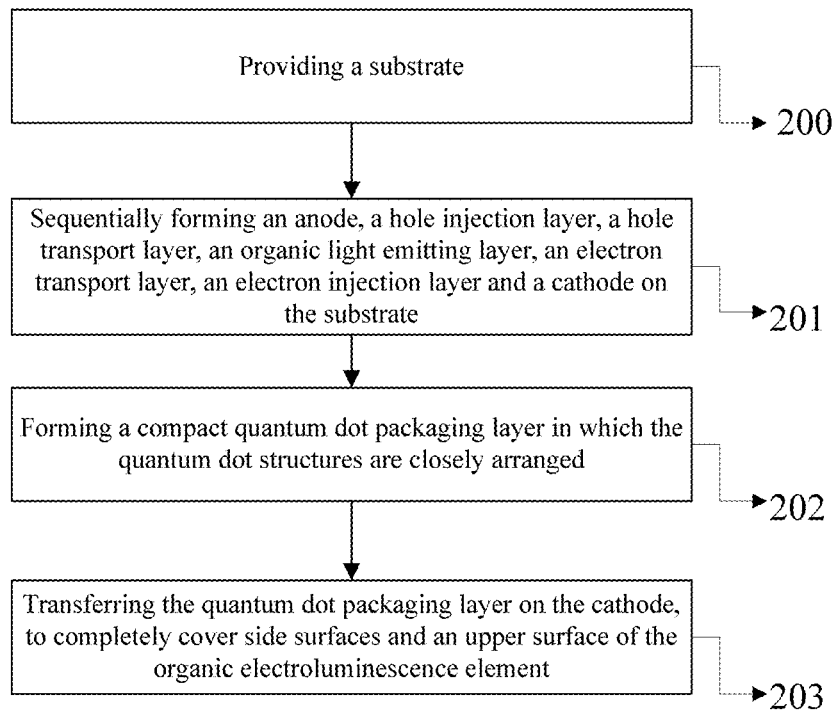
FIG. 8 is a flow diagram of a quantum dot imprinting process provided by at least one embodiment of the present disclosure.

FIG. 8 is a flow schematic diagram of a quantum dot impression process provided by at least one embodiment of the present disclosure. As illustrated by FIG. 8, the packaging method for an organic electroluminescence element provided by the present embodiment can specifically include the following steps.

200: Providing a substrate

201: Sequentially forming an anode, a hole injection layer, a hole transport layer, an organic light emitting layer, an electron transport layer, an electron injection layer and a cathode on the substrate;

202: Forming a compact quantum dot packaging layer in which the quantum dots are closely arranged;

203: Transferring the compact quantum dot packaging layer on the cathode, to completely cover the side surface and the upper surface of the organic electroluminescence element.

In the other embodiments of the present disclosure, the organic electroluminescence element can be an inverted organic electroluminescence element. Forming the inverted organic electroluminescence element includes: sequentially forming a substrate, a cathode, an electron injection layer, an electron transport layer, an organic light emitting layer, a hole transport layer, a hole injection layer, and an anode. The manufacturing method of forming a package structure for an organic electroluminescence element having the inverted organic electroluminescence element and the manufacturing method of forming a package structure for an organic electroluminescence element having the positive organic electroluminescence element have the similar realization principles and technical effects, and the repeated portions are omitted herein.

The package structure for an organic electroluminescence element in the packaging method for an organic electroluminescence element provided by the present embodiment can be the package structure for an organic electroluminescence element according to the first embodiment or the second embodiment, and its specific structure, such as a substrate, an organic electroluminescence element, and a quantum dot packaging layer are similar to the substrate, the organic electroluminescence element, and the quantum dot packaging layer in the present embodiment, and the realization principles are the same, the repeated portions are omitted herein.

Figure 9:
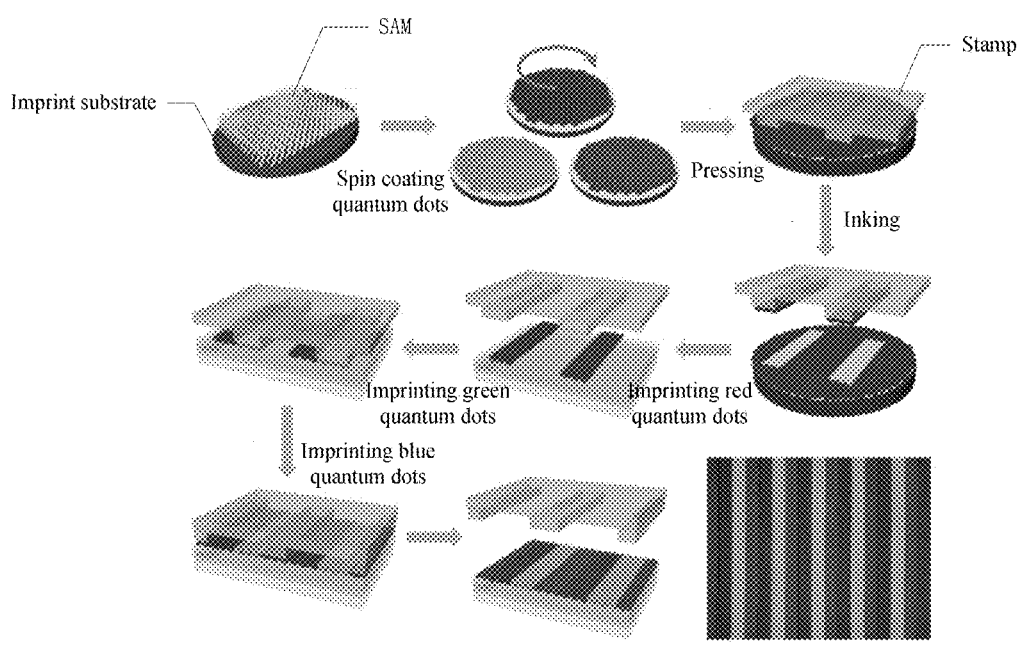
FIG. 9 is a flow diagram of another quantum dot imprinting process provided by at least one embodiment of the present disclosure.

FIG. 9 is a flow diagram of another quantum dot imprinting process provided by at least one embodiment of the present disclosure. On the basis of the packaging method for an organic electroluminescence element according to the fifth embodiment, as illustrated by FIG. 9, the packaging method for an organic electroluminescence element can specifically include the following steps.

The quantum dot packaging layer is formed through an imprint method. Firstly, respectively spin coating quantum dots with different luminous colors on different self-assembled monolayer (SAM) imprint substrate corresponding to the quantum dots with different luminous colors, for example, respectively spin coating red quantum dots, green quantum dots, and blue quantum dots on a red quantum dot imprint substrate, a green quantum dot imprint substrate and a blue quantum dot imprint substrate; secondly, for example, using a silicon wafer having a pattern as a "stamp", and pressing it on the quantum dot imprint substrate, for example, a red quantum dot imprint substrate, selecting red quantum dots with a suitable size through an "inking stamp" method, and then impressing the red quantum dots on a thin film base to form a red quantum dot band; again, using a silicon wafer having a pattern as a "stamp", and pressing it on a green quantum dot imprint substrate, to select green quantum dots with a suitable size, and then impressing the green quantum dots on the same thin film base at a position close to the red quantum dots to form a green quantum dot band; finally, using a silicon wafer having a pattern as a "stamp", and pressing it on a blue quantum dot imprint substrate, to select blue quantum dots with a suitable size, and then impressing the blue quantum dots on the same thin film base at a position close to the green quantum dots to form a blue quantum dot band, so as to form a quantum dot packaging layer consisting of a red quantum dot band, a green quantum dot band and a blue quantum dot band. And, on this basis, forming an organic electroluminescence element packaging display device including a plurality of red pixel columns, a plurality of green pixel columns, and a plurality of blue pixel columns which are sequentially and repeatedly arranged at intervals.

The quantum dot packaging layer formed in this stage is similar to colloid, can be conveniently transferred to an organic electroluminescence element to completely cover the organic electroluminescence element and the substrate, and can be hermitically connected with the substrate.

During the imprinting process of the present embodiment, on average, there are 3 trillion quantum dots per square centimeter, and 100% imprinting can be realized by changing the speed and pressure of the "stamp". The density and the consistency of the quantum dots of display device formed through the abovementioned method are higher, and the display device can produce a brighter image with higher energy efficiency.

For example, the imprint method illustrated by FIG. 9 forms quantum dot bands with different colors, and is suitable for the display panel illustrated by FIG. 6 in which the same column are light emitting structures of the same color. However, the implementations according to the present disclosure are not limited thereto, and can form other quantum dot impression pattern with different arrangements.

Embodiments of the present disclosure provide at least one of the following beneficial effects.

At least one embodiment of the present disclosure significantly improves the sealing performance of an OLED display device, avoids the erosion of water and oxygen, and effectively prolongs the serve life of the device by disposing a quantum dot packaging layer.

At least one embodiment of the present disclosure avoids the damage caused by the friction between the OLED element and metal or glass cover plate and the short circuit caused by the contact between the OLED element and the metal cover plate by disposing a quantum dot packaging layer.

At least one embodiment of the present disclosure simplifies the packaging process and reduces the volume and weight of the packaged OLED element by disposing a quantum dot packaging layer.

At least one embodiment of the present disclosure improves the optical characteristics such as color gamut by disposing a quantum dot packaging layer.

At least one embodiment of the present disclosure further improves the sealing performance and the optical characteristics such as color gamut by disposing a core-shell quantum dot packaging layer due to the high transmittance, high light stability, scratch resistance, good water-oxygen erosion resistant ability of the core-shell quantum dot material.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or reduced, that is to say, the figures are not drawn according to the actual scale. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, features in one embodiment or in different embodiments can be combined.

The foregoing is only the preferred embodiments of the present invention and not intended to limit the scope of protection of the present invention. The scope of protection of the present invention should be defined by the appended claims.

The present application claims priority of China Patent application No. 201611062387.9 filed on Nov. 28, 2016, the content of which is incorporated in its entirety as portion of the present application by reference herein.

What is claimed is:

1. A package structure for an organic electroluminescence element, comprising:
a substrate;
an organic electroluminescence element, disposed on the substrate, the organic electroluminescence element at least comprising a first electrode, a second electrode and an organic light emitting layer disposed between the first electrode and the second electrode; and
a quantum dot packaging layer, disposed on the substrate and the organic electroluminescence element, wherein the quantum dot packaging layer comprises only quantum dots closely arranged to form a compact layer,
wherein the quantum dots comprises at least one quantum dot material selected from the group consisting of zinc oxide, graphene, CdSe, CdS, CdTe, ZnSe, ZnTe and ZnS,
and the quantum dot packaging layer completely covers and is in direct contact with a side surface and an upper surface of the organic electroluminescence element, wherein the side surface and the upper surface are directly connected with each other.

2. The package structure for the organic electroluminescence element according to claim 1, wherein the at least one quantum dot material comprises a core-shell quantum dot material, and the core-shell quantum dot material comprises at least two layers of core-shell layer structures.

3. The package structure for the organic electroluminescence element according to claim 2, wherein the at least two layers of core-shell layer structures have different materials.

4. The package structure for the organic electroluminescence element according to claim 3, wherein the core-shell quantum dot material includes a core material and a shell material, the shell material is a water-oxygen erosion resistant material, and the core material is a light-transmitting luminescent material.

5. The package structure for the organic electroluminescence element according to claim 1, wherein the organic electroluminescence element comprises at least one selected from the group consisting of a red organic electroluminescence element, a green organic electroluminescence element, a blue organic electroluminescence element and a white organic electroluminescence element.

6. The package structure for the organic electroluminescence element according to claim 1, wherein the at least one quantum dot material comprises quantum dot materials of different luminescent wavelengths.

7. The package structure for the organic electroluminescence element according to claim 1, wherein the quantum dot packaging layer is formed through an imprint method.

8. The package structure for the organic electroluminescence element according to claim 1, wherein the organic electroluminescence element is a top emitting type organic electroluminescence element.

9. An organic electroluminescence device, comprising a package structure for an organic electroluminescence element according to claim 1, wherein a plurality of organic electroluminescence elements are disposed on the substrate in an array.

10. The package structure for the organic electroluminescence element according to claim 1, wherein the quantum dot packaging layer completely covers and is in direct contact with lateral side surfaces of the organic electroluminescence element.

11. A packaging method for an organic electroluminescence element, comprising:
providing a substrate;
forming an organic electroluminescence element on the substrate, the organic electroluminescence element at least comprising a first electrode, a second electrode and an organic light emitting layer disposed between the first electrode and the second electrode; and
forming a quantum dot packaging layer on the substrate and the organic electroluminescence element, wherein
the quantum dot packaging layer comprises only quantum dots closely arranged to form a compact layer,
wherein the quantum dots comprises at least one quantum dot material selected from the group consisting of zinc oxide, graphene, CdSe, CdS, CdTe, ZnSe, ZnTe and ZnS, and
the quantum dot packaging layer completely covers and is in direct contact with a side surface and an upper surface of the organic electroluminescence element, wherein
the side surface and the upper surface are directly connected with each other.

12. The packaging method for the organic electroluminescence element according to claim 11, wherein forming the quantum dot packaging layer comprises using an imprint method to form the quantum dot packaging layer.

13. The packaging method for the organic electroluminescence element according to claim 12, wherein using the imprint method to form the quantum dot packaging layer comprises:
applying the at least one quantum dot material on an imprint substrate;
using a silicon wafer having a pattern to select the at least one quantum dot material and imprinting the quantum dot material on a base; and
transferring the at least one quantum dot material imprinted on the base to the substrate and the organic electroluminescence element.

14. The packaging method for the organic electroluminescence element according to claim 13, wherein transferring the at least one quantum dot material imprinted on the base to the substrate and the organic electroluminescence element comprises:
covering the substrate and the organic electroluminescence element with the at least one quantum dot material imprinted on the base so as to completely cover a side surface and an upper surface of the organic electroluminescence element.

* * * * *